United States Patent [19]
Alvarez et al.

[11] Patent Number: 5,821,757
[45] Date of Patent: Oct. 13, 1998

[54] NOISE REDUCTION IN AN ON-LINE BATTERY IMPEDANCE MEASUREMENT SYSTEM

[75] Inventors: Jose A. Alvarez, Elizabeth; Allan M. Dob, Clifton, both of N.J.

[73] Assignee: Btech, Inc., Whippany, N.J.

[21] Appl. No.: 859,165

[22] Filed: May 20, 1997

[51] Int. Cl.$^6$ .............................. G01N 27/416; H02J 7/04
[52] U.S. Cl. .................. 324/434; 324/430; 340/636; 320/120
[58] Field of Search ................................ 324/429, 430, 324/433, 434; 340/636; 320/218, 116, 119, 120; 174/113 R

[56] References Cited

U.S. PATENT DOCUMENTS

| | | | |
|---|---|---|---|
| 3,818,325 | 6/1974 | Boshers | 324/434 |
| 3,873,911 | 3/1975 | Champlin | 324/430 |
| 5,047,722 | 9/1991 | Wurst et al. | 324/430 |
| 5,281,920 | 1/1994 | Wurst | 324/430 |
| 5,424,491 | 6/1995 | Walling et al. | 174/113 R |

*Primary Examiner*—Diep N. Do
*Attorney, Agent, or Firm*—David L. Davis

[57] ABSTRACT

Connections between batteries and impedance measuring circuitry in a system for on-line measurement of battery cell impedance is effected by twisted wire triplets.

7 Claims, 2 Drawing Sheets

NOISE REDUCTION IN AN ON-LINE BATTERY IMPEDANCE MEASUREMENT SYSTEM

BACKGROUND OF THE INVENTION

This invention relates to a system for on-line measurement of battery cell impedance in a battery backup system having a large number of battery cells and, more particularly, to the reduction of induced electrical noise in such a system.

Large battery systems are commonly used to provide backup power in case there is a failure of the commercial power grid. Typically, such a backup system includes one or more parallel strings of serially connected rechargeable battery cells and a charger connected to the commercial power grid for maintaining the charge on the battery cells. An inverter is coupled between the strings of battery cells and the load, the inverter being enabled upon detection of a power grid failure. In some applications, the inverter may be continuously operational to power the load with energy from the charger during the time that commercial power is available. Many of these battery backup systems, called "uninterruptable power supplies", are configured such that the load is never aware of any failure of the power grid because the battery system immediately supplies the necessary energy upon failure of the power grid.

A typical installation of such an uninterruptable power supply is between the power grid and a large computer system used by financial, communications, manufacturing and other commercial industries. If the battery system is taken "off-line" for any reason, the necessary protection against power outages is lost for the time that the battery system is not connected plus the time for recharging, if a significant amount of charge has been removed during the off-line period of time. However, such battery backup systems must be monitored on a regular basis to insure that protection from power grid failure is always available.

Impedance measurement is a method by which the condition of a battery may be assessed without taking the battery off-line. Impedance measurements typically impose a current (hereinafter called the "loading current") on the part to be evaluated and measure the resultant voltage. Various commercially available test instruments function this way. Using Kelvin connections, these instruments impose a current on just the component to be measured. After a measurement has been made, the operator moves the Kelvin clips to the next component, reads the value, moves the clips again, and continues in this manner until all the components have been measured. Therefore, the loading current flows almost entirely through the component being measured, the parallel paths (if they exist) generally being of so much higher impedance that any loading current flowing through them is of little or no consequence.

U.S. Pat. No. 5,047,722 discloses a system for measuring the impedance of a battery cell within a string of battery cells. The disclosed system draws a pulsed, measured or controlled loading current from the entire string and, while doing so, measures the voltage across each of the cells or groups of cells which make up the battery string. However, if the output impedance of the charger is extremely low compared to the impedance of the battery at the measurement frequency, or if the battery is composed of multiple parallel strings, then only some part of the loading current being drawn to make the measurement will be flowing through the cell or interconnection being tested. If this is the case, the calculated impedance may be less than the true value. In the extreme case, generally when the impedance of the charger is very low (the practice of placing a large capacitance across the charger output terminals to protect the battery from ripple currents is becoming increasingly prevalent with uninterruptable power supply manufacturers), such a small percentage of the loading current comes from the battery that impedance measurement is virtually impossible. Of course, when a low output impedance charger is used, the charger is the dominant shunt impedance, so that the presence of any number of parallel strings of cells is of no consequence.

U.S. Pat. No. 5,281,920 discloses an improved system which measures battery cell impedance in a battery backup system of the type described and obviates all of the aforedescribed problems which result from low charger impedance and the existence of multiple parallel strings. As disclosed, the improved system measures battery cell impedances in a battery backup system having at least one string of battery cells by only imposing the loading current on a portion of one of the strings at any given time. Battery cell voltage measurements are made only within this string portion. Then, the loading current connections are moved to another string portion and voltage measurements are performed within that string portion. This process is continued until all of the battery cells within the battery backup system have been examined. While this system functions as designed to obviate the problems resulting from low charger impedance and the existence of multiple parallel strings, it has been found that the wires which extend from the battery cells to the measurement circuitry become in effect large antennas, requiring careful placement and routing through battery racks and cabinets to minimize "pickup"effects. These pickup effects include general electrical noise as well as electromagnetic noise induced in the wires. This noise results in differential currents being induced in the two wires connected across each battery cell, thereby degrading the measurement results.

It is therefore an object of the present invention to reduce such differential currents so as to be able to provide more consistent and more accurate impedance measurements.

SUMMARY OF THE INVENTION

The present invention finds utility in a system for monitoring the condition of a string of serially connected battery cells. This system includes connections across groups of at least one of the battery cells and a controllable switch coupled to the connections via conductors. The switch is controllable to couple in succession each of the groups of battery cells to measurement circuitry. In accordance with the principles of this invention, induced differential currents in each pair of conductors connected across a respective one of the battery cells is reduced by a method comprising the steps of:

(a) for each of the groups of battery cells, connecting a first end of a respective insulated conductor to each end of the serial string of battery cells in each group and to each intermediate junction of the serial string of battery cells in each group;

(b) for each of the groups of battery cells, bundling together all of the associated insulated conductors; and (c) for each of the groups of battery cells, connecting the other end of each of the insulated conductors to the switch.

In accordance with an aspect of this invention, bundling of the conductors is effected by twisting the conductors together.

In accordance with another aspect of this invention, the switch is coupled to the battery cells by a coupling arrangement comprising a plurality of groups of three insulated conductors, wherein the three insulated conductors in each of the groups of three insulated conductors are bundled together. A first end of a first conductor in each of the groups of three conductors is connected to the anode (positive terminal) of a respective first battery cell, a first end of a second conductor in each of the groups of three conductors is connected to the cathode (negative terminal) of the respective first battery cell, and a first end of the third conductor in each of the groups of three conductors is connected to the cathode of a respective second battery cell whose anode is connected to the cathode of the respective first battery cell. The second end of each conductor in each of the groups of three conductors is connected to the second switch.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
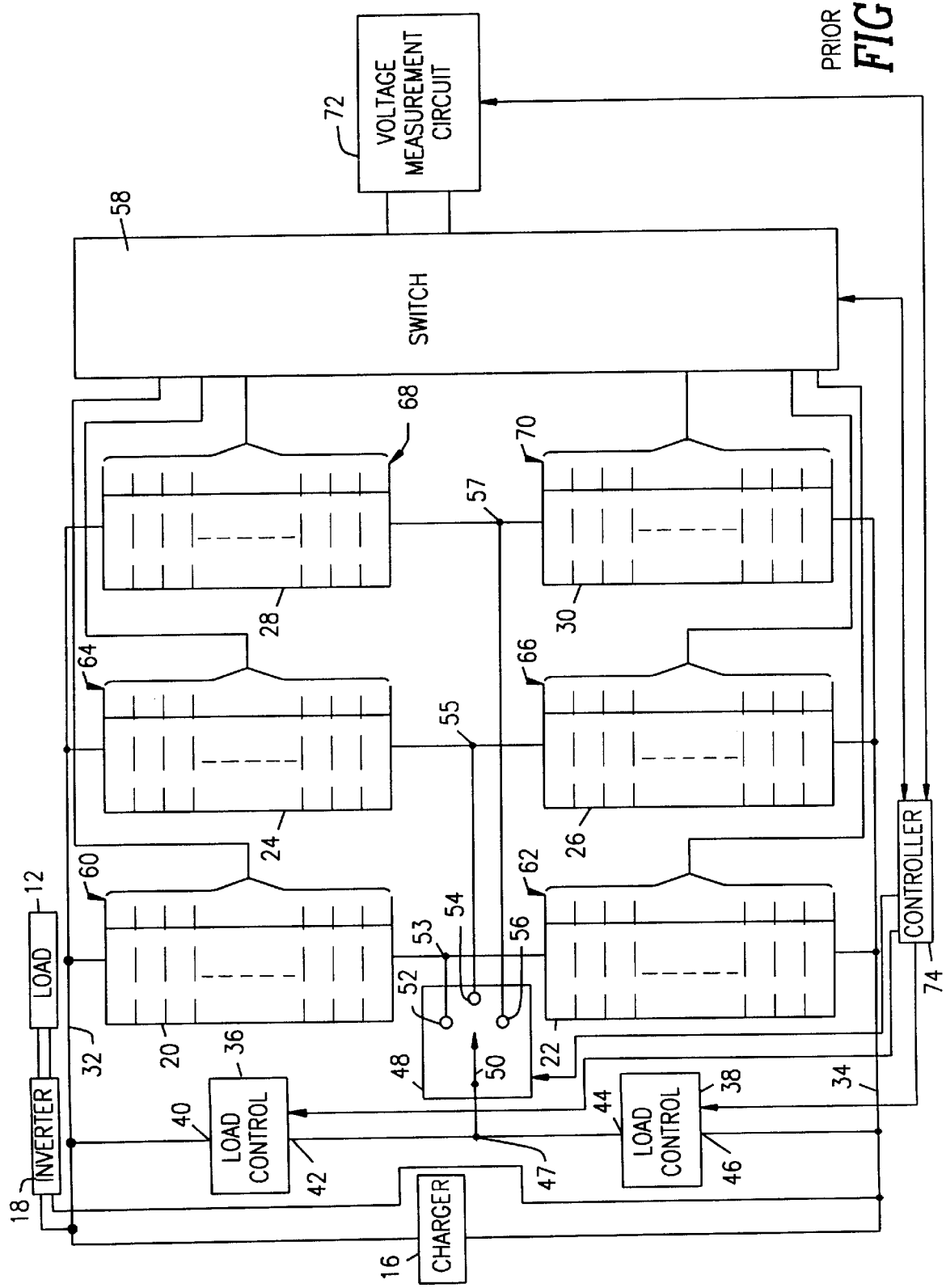
FIG. 1 is an overall block diagram of the prior art battery impedance measurement system disclosed in U.S. Pat. No. 5,281,920.

FIG. 1 shows the measurement system disclosed in U.S. Pat. No. 5,281,920, the contents of which are hereby incorporated by reference. For illustration, the batteries of the backup system will be described as comprising three parallel strings of one hundred cells each, coupled to the load 12 through the inverter 18. The charge of the battery cells is maintained by the charger 16. Illustratively, each of the strings is divided into two portions of fifty cells each. Thus, as shown in FIG. 1, the first string comprises the portions 20 and 22; the second string comprises the portions 24 and 26; and the third string comprises the portions 28 and 30. The strings 20, 22; 24, 26; and 28, 30 are connected in parallel between a first rail 32 and a second rail 34. There are also provided two load control circuits 36 and 38. Preferably, the load control circuits 36, 38 are of the type disclosed in U.S. Pat. No. 5,047,722, the contents of which are hereby incorporated by reference. The load control circuits 36, 38 act as on/off switches and, when on, as current regulators. The load control circuit 36 has its first terminal 40 connected to the first rail 32 and its second terminal 42 connected to the first terminal 44 of the load control circuit 38. The second terminal 46 of the load control circuit 38 is connected to the second rail 34. The junction 47 of the second terminal 42 of the load control circuit 36 and the first terminal 44 of the load control circuit 38 is connected to a first switch 48. For purposes of illustration, the first switch 48 is shown as a single pole triple throw switch. The junction 47 is connected to the armature 50 of the switch 48. The switch 48 is for the purpose of selectively connecting the load control circuits 36, 38 to intermediate points in the battery strings. Thus, the terminal 52 of the switch 48 is connected to the intermediate point 53 between the portions 20 and 22 of the first string; the terminal 54 of the switch 48 is connected to the intermediate point 55 between the portions 24 and 26 of the second string; and the terminal 56 of the switch 48 is connected to the intermediate point 57 between the portions 28 and 30 of the third string. Illustratively, these intermediate points are the mid-points of the respective strings.

Connections are also provided across groups of the battery cells within the strings. Preferably, these connections are provided across each individual battery cell. The battery cells making up the strings are rechargeable cells having exposed terminals at their anodes and cathodes. These battery cell connections are all coupled to the second switch 58. Thus, the connections 60 of the first portion 20 of the first string, the connections 62 of the second portion 22 of the first string, the connections 64 of the first portion 24 of the second string, the connections 66 of the second portion 26 of the second string, the connections 68 of the first portion 28 of the third string, and the connections 70 of the second portion 30 of the third string are all coupled to the switch 58. The switch 58 is also coupled to the voltage measurement circuit 72, which is preferably an AC voltmeter, as disclosed in the aforereferenced '722 patent.

The system shown in FIG. 1 is under the control of the controller 74, which may be an appropriately programmed computer. The controller 74 is coupled to the load control circuits 36 and 38, the first switch 48, the second switch 58, and the voltage measurement circuit 72. Controller 74 is operative to control the switch 48 to select one of the three parallel strings and then to make operative one of the load control circuits 36 and 38. At any given time, only one of the load control circuits 36 and 38 is operative. Thus, at any given time, only one of the string portions 20, 22, 24, 26, 28 and 30 is connected to an operative one of the load control circuits 36 and 38. The controller 74 controls the switch 58 to connect in succession each of the cells within that string portion to the voltage measurement circuit 72, which communicates with the controller 74 and transmits its measurements thereto for analysis. A full discussion of the measurements is set forth in the aforereferenced '920 patent and the reader is referred thereto if further details are desired.

Figure 2:
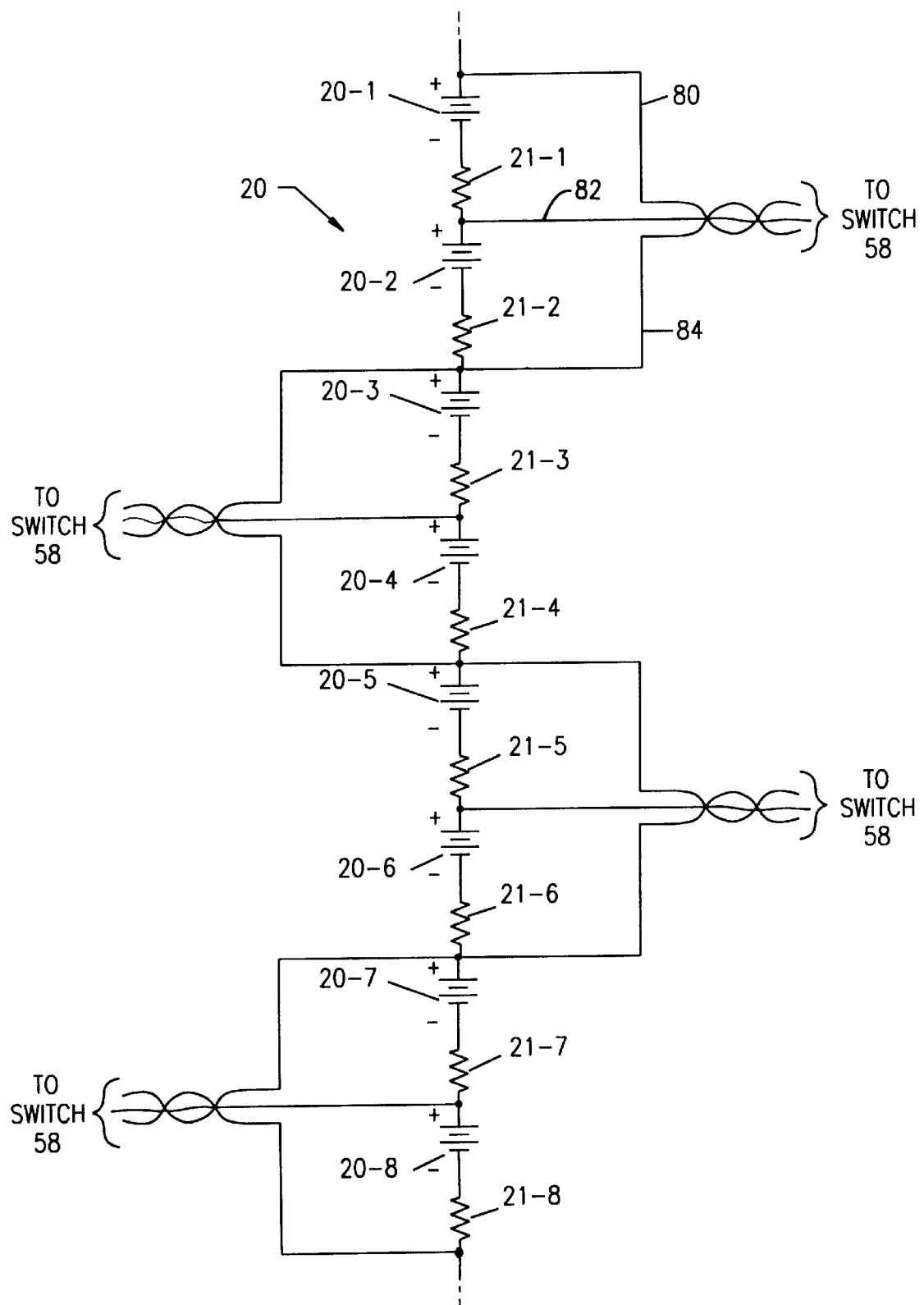
FIG. 2 shows an illustrative embodiment of how the noise reducing improvement according to this invention is implemented.

FIG. 2 illustrates the connections from the string portion 20 to the switch 58 according to the present invention. As shown, the string portion 20 includes a plurality of serially connected rechargeable battery cells 20-1, 20-2, 20-3, etc., each having an internal resistance 21-1, 21-2, 21-3, etc., respectively. Illustratively, the string portion 20 is divided into groups of two battery cells each, and each group of two battery cells is connected to the switch 58 by three insulated wires which are bundled together. By bundling the wires together, the individual wires in each group of bundled wires is exposed to the same electromagnetic fields, and therefore has the same currents induced therein. The induced currents in each pair of the bundled wires will be cancelled out in the voltage measurement circuit 72, and therefore will not affect the measured impedance of the battery cells. Such bundling may be effected by tying the wires together along their length, by an adhesive or other bond between their insulated covers, or by twisting the wires together. At the present time, twisting is preferred.

Thus, for the group including the cells 20-1 and 20-2, there is provided the insulated wires 80, 82 and 84, which are twisted together, as shown. A first end of the wire 80 is connected to the anode of the battery cell 20-1.

A first end of the wire 82 is connected to the cathode of the battery cell 20-1 through its internal resistance 21-1. A first end of the wire 84 is connected to the cathode of the battery cell 20-2, through its internal resistance 21-2. After their points of connection to the battery cells, the three wires 80,82, 84, which are twisted together, are extended to the switch 58, to which their second ends are connected. Thus, within a group of battery cells, the twisted conductors are connected to each end of the serial string of battery cells in each group and to the intermediate junction of the serial string of battery cells in the group. This connection arrangement is repeated for each pair of battery cells in the string portion 20. Thus, for each pair of battery cells, three wires extend to the switch 58.

It has been found that forming approximately eight twists per foot of the three conductors provides satisfactory results.

The grouping of the conductors as triplets results in a savings of 25% in materials over the use of individual pairs of conductors. Further, while groups of three conductors have been shown, it is understood that four conductors connected to three battery cells would also be effective, as would N+1 conductors for N battery cells. However, as N increases, the resulting twisted cable becomes unwieldy.

Accordingly, there has been disclosed an improvement in the reduction of induced electrical noise in an on-line battery impedance measurement system. While an exemplary embodiment has been disclosed herein, it will be appreciated by those skilled in the art that various modifications and adaptations to the disclosed embodiment may be made and it is intended that this invention be limited only by the scope of the appended claims.

What is claimed is:

1. In a system for monitoring the condition a string of serially connected battery cells, the battery cells being divided into a plurality of groups of at least two adjacent cells in the string, the system including measurement circuitry, connections to the battery cells and a controllable switch coupled via conductors between the measurement circuitry and the connections, wherein the switch is controllable to couple in sucession each of the groups of battery cells to the measurement circuitry, a method for reducing induced differential currents in conductors connected between the battery cells and the switch, the method comprising the steps of:

(a) providing insulated conductors;

(b) for each of said groups of adjacent battery cells, connecting first ends of respective insulated conductors to each end of the serial string of adjacent battery cells in said each group and to each intermediate junction of the serial string of adjacent battery cells in said each group;

(c) for each of said groups of adjacent battery cells, bundling together all of the associated insulated conductors; and (d) for each of said groups of adjacent battery cells, connecting the other ends of the associated insulated conductors to the switch;

wherein for connecting each group of adjacent battery cells to the switch there is one more associated insulated conductor than there are adjacent battery cells in said each group.

2. The method according to claim 1 wherein each of said groups of adjacent battery cells contains two battery cells and there are three insulated which are twisted together and associated with each of the two battery cells in said each group.

3. The method according to claim 2 wherein step (c) includes the step of forming approximately eight twists per foot of said insulated conductors.

4. The method according to claim 11 wherein step (c) includes the step of twisting together all of the insulated conductors associated with each of said groups of battery cells.

5. In combination with a battery system having at least one string of serially connected rechargeable battery cells and charging means connected across said at least one string for charging said battery cells, an arrangement for measuring the impedance of said battery cells without disconnecting said battery cells from said battery system, the arrangement comprising:

means for providing connections across groups of adjacent ones of said battery cells, each of said groups being within a respective single string and including at least two battery cells;

load means for conducting electrical current;

first switching means coupled between said load means and at least one predetermined point in each of said at least one string, said at least one predetermined point dividing said each string into at least two portions, there being at least one of said groups of cells within each of said portions within said each string;

second switching means coupled to said connections;

voltage measuring means coupled to said second switching means; and control means coupled to said first and second switching means for controlling said first switching means to couple said load means in succession across each portion of said each string and for controlling said second switching means to couple said voltage measuring means in succession across each of the groups of cells within the portion of said each string to which the load means is coupled at that time;

CHARACTERIZED IN THAT:

said second switching means is coupled to said connections by a coupling arrangement comprising:

a plurality of groups of three insulated conductors, wherein the three insulated conductors in each of said groups of three insulated conductors are bundled together;

means for connecting a first end of a first insulated conductor in each of said groups of three insulated conductors to the anode of a respective first battery cell in a respective one of said groups of battery cells;

means for connecting a first end of a second insulated conductor in each of said groups of three insulated conductors to the cathode of said respective first battery cell;

means for connecting a first end of the third insulated conductor in each of said groups of three insulated conductors to the cathode of a respective second battery cell in said one group of battery cells whose anode is connected to the cathode of said respective first battery cell; and means for connecting the second end of each insulated conductor in each of said groups of three insulated conductors to said second switching means.

6. The coupling arrangement according to claim 5 further characterized in that each of said groups of three insulated conductors are twisted together.

7. The coupling arrangement according to claim 6 further characterized in that each of said groups of three insulated conductors are twisted together with approximately eight twists per foot.

* * * * *

UNITED STATES PATENT AND TRADEMARK OFFICE
CERTIFICATE OF CORRECTION

PATENT NO. : 5,821,757
DATED : Oct. 13, 1998
INVENTOR(S) : Jose A. Alvarez and Allan M. Dob It is certified that error appears in the above-indentified patent and that said Letters Patent is hereby corrected as shown below:

Column 5, line 55, after "insulated", insert -- conductors --.

Column 5, line 61, change "11" to -- 1 --.

Signed and Sealed this

Twenty-ninth Day of December, 1998

Attest:

BRUCE LEHMAN

Attesting Officer

Commissioner of Patents and Trademarks